United States Patent [19]
Saika et al.

[11] Patent Number: 5,027,176
[45] Date of Patent: Jun. 25, 1991

[54] PHOTO-ELECTRIC CONVERTER WITH INTERVENING WIRINGS FOR CAPACITIVE SHIELDING

[75] Inventors: Toshihiro Saika, Hiratsuka; Katsunori Hatanaka, Yokohama, both of Japan

[73] Assignee: Canon Kabushiki Kaisha, Tokyo, Japan

[21] Appl. No.: 496,153

[22] Filed: Mar. 19, 1990

Related U.S. Application Data

[63] Continuation of Ser. No. 382,072, Jul. 17, 1989, abandoned, which is a continuation of Ser. No. 241,839, Sep. 6, 1988, abandoned, which is a continuation of Ser. No. 79,015, Jul. 29, 1987, abandoned.

[30] Foreign Application Priority Data

Aug. 12, 1986 [JP] Japan .................. 61-187841

[51] Int. Cl.$^5$ ............................. H01L 27/14
[52] U.S. Cl. ........................ 357/30; 357/32; 357/53; 250/578.1
[58] Field of Search ............ 357/30 H, 30 G, 30 D, 357/30 M, 31, 32, 53, 8, 23.15, 305; 250/578.1, 211 R

[56] References Cited

U.S. PATENT DOCUMENTS

| | | | |
|---|---|---|---|
| 3,811,076 | 5/1974 | Smith, Jr. ................... | 357/53 X |
| 3,841,926 | 10/1974 | Garnache et al. ............ | 357/53 X |
| 3,898,685 | 8/1975 | Engeler et al. .............. | 357/30 H X |
| 3,932,775 | 1/1976 | Kosonocky .................. | 357/30 H X |
| 4,035,829 | 7/1977 | Ipri et al. .................... | 357/53 X |
| 4,480,009 | 10/1984 | Berger ........................ | 357/8 X |
| 4,609,935 | 9/1986 | Kondo .......................... | 357/53 X |
| 4,650,984 | 3/1987 | Furushima et al. ......... | 250/211 R |
| 4,675,549 | 6/1987 | Steffe et al. ................. | 357/30 H X |

FOREIGN PATENT DOCUMENTS

| | | |
|---|---|---|
| 0079775 | 5/1983 | European Pat. Off. . |
| 0294833 | 12/1988 | European Pat. Off. . |
| 3500645 | 7/1985 | Fed. Rep. of Germany . |
| 60-178663 | 9/1985 | Japan . |
| 61-32571 | 2/1986 | Japan . |
| 62-67864 | 3/1987 | Japan . |

OTHER PUBLICATIONS

Kern et al., "Advances in Deposition Processes for Passivation Films," *Journal of Vacuum Science & Technology*, vol. 14, No. 5, Sep./Oct. 1977, pp. 1082–99.
Cavaliere et al., "Reduction of Capacitive Coupling Between Adjacent Dielectrically Supported Conductors," *IBM Technical Disclosure Bulletin*, vol. 21, No. 21, May 1979, p. 4827.

Primary Examiner—William Mintel
Attorney, Agent, or Firm—Fitzpatrick, Cella, Harper & Scinto

[57] ABSTRACT

A photo-electric converter having linearly arranged photo-electric elements. Common lines are each connected to at least two discrete output electrodes of corresponding photoelectric elements. A conductor arranged between insulator layers at crosspoints of the discrete output electrodes and the common lines is maintained at a constant potential. A wiring is formed between the discrete electrode and the common electrode and is maintained at a constant potential.

24 Claims, 4 Drawing Sheets

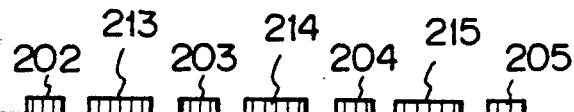
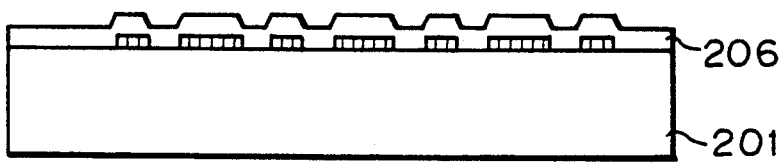
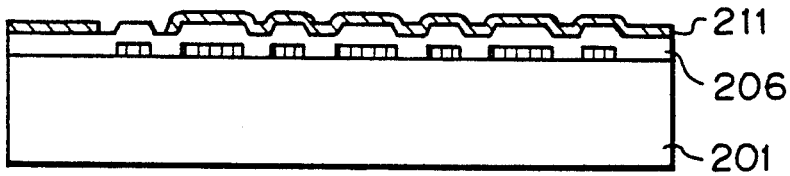
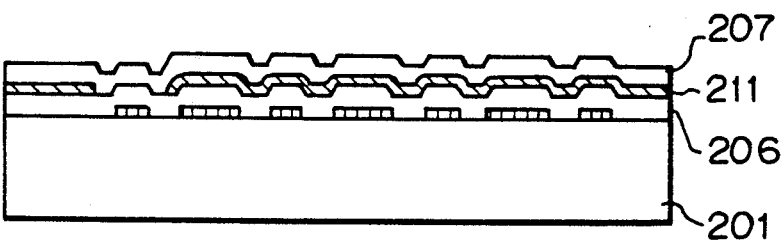
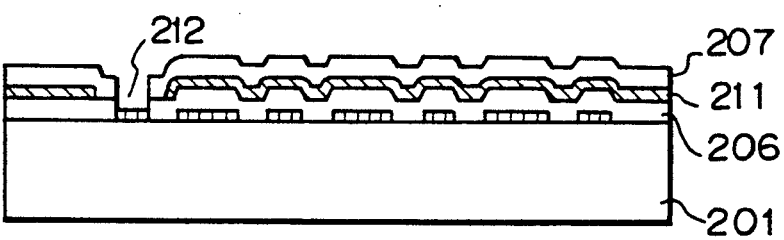
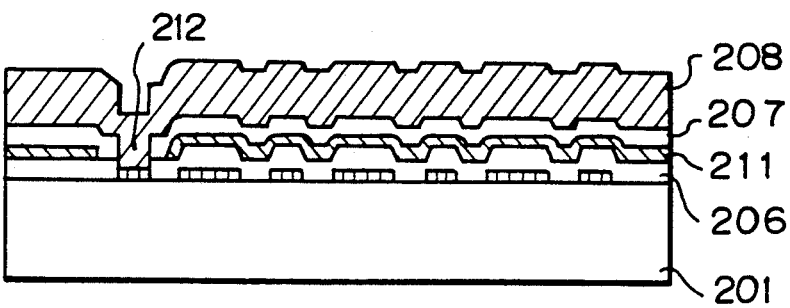

PHOTO-ELECTRIC CONVERTER WITH INTERVENING WIRINGS FOR CAPACITIVE SHIELDING

This application is a continuation of application Ser. No. 07/382,072 filed July 17, 1989 which is a continuation of application Ser. No. 07/241,839 filed Sept. 6, 1988, which is a continuation of application Ser. No. 07/079,015 filed July 29, 1987 all now abandoned.

BACKGROUND OF THE INVENTION

1. Field of the Invention

The present invention relates to a photo-electric converter, and more particularly to a photo-electric converter used for reading an image in facsimile machine, image reader, digital copying machine or electronic backboard 2. Related Background Art In order to reduce the size and enhance the performance of a facsimile machine or image reader, a web type line sensor having a unity magnification optical system as a photo-electric converter has been developed. In the past, such a line sensor has comprised a linear array of photo-electric conversion elements having a signal processing IC (integrated circuit) consisting of switching elements connected thereto. However, the number of such photo-electric conversion elements amounts to 1728 for a size A4 in the facsimile G3 specification and hence a number of signal processing IC's are required. As a result, the number of packaging steps increases and the manufacturing cost and reliability are not satisfactory. On the other hand, in order to reduce the number of signal processing IC's and the number of packaging steps, a matrix wiring has been adapted.

FIG. 1 shows a block diagram of a matrix-wired photo-electric converter. Numeral 1 denotes a photoelectric conversion element unit, numeral 2 denotes a scan unit, numeral 3 denotes a signal processing unit and numeral 4 denotes a matrix wiring unit. FIG. 2 shows a plan view of a prior art matrix wiring unit and FIGS. 3(a) and 3(b) show A-A' and B-B' cross-sectional views of FIG. 2.

In FIGS. 3(a) and 3(b), numeral 601 denotes a substrate, numerals 602 to 605 denote discrete electrodes, numerals 607 to 609 denote common lines and numeral 610 denotes a through-hole which ohmically contacts the discrete electrodes to the common lines. Numeral 606 denotes an insulating layer.

In such a matrix-wired photo-electric converter, the number of signal processing circuits in the signal processing unit 3 may be equal to the number of output lines of the matrix. Thus, the signal processing unit may be compact and cost reduction of the photoelectric converter is attained.

However, the prior art matrix-wired photoelectric converter has the following problems.

Since weak outputs of the photo-electric conversion elements are read through the matrix wiring, crosstalk occurs between the output signals, unless stray capacitance at insulated crosspoints of the discrete output electrodes of the photo-electric conversion elements and the common line of the matrix is sufficiently small. This is a severe restriction of the selection of interlayer insulation material and the design of the dimension of the matrix.

Since the matrix common lines are arranged longitudinally, they may be as long as 210 mm for a line sensor of a size A4. Accordingly, unless a line-to-line capacitance between the common lines is sufficiently small, the crosstalk occurs between the output signals. This leads to increase of size of the matrix unit.

A pitch of the discrete output electrodes of the photo-electric conversion elements may be 125 $\mu$m in the photo-electric converter having a resolution of 8 lines/mm. Accordingly, unless the line-to-line capacitance of the discrete electrodes is sufficiently small, crosstalk occurs between the output signals.

SUMMARY OF THE INVENTION

It is an object of the present invention to provide a photo-electric converter having a compact matrix wiring which is free from crosstalk between output signals.

It is another object of the present invention to provide a photo-electric converter comprising a plurality of linearly arranged photo-electric conversion elements, a plurality of common lines each connecting in common at least two of discrete output electrodes of the photo-electric conversion elements, a conductive layer for keeping a constant potential at crosspoints of the discrete output electrodes and the common lines, and wiring for keeping a constant potential between the separate electrodes and the common electrodes.

BRIEF DESCRIPTION OF THE DRAWINGS

FIGS. 6(a) to 6(f) show steps of manufacturing the matrix wiring of the present invention.

DETAILED DESCRIPTION OF THE PREFERRED EMBODIMENTS

Figure 1:
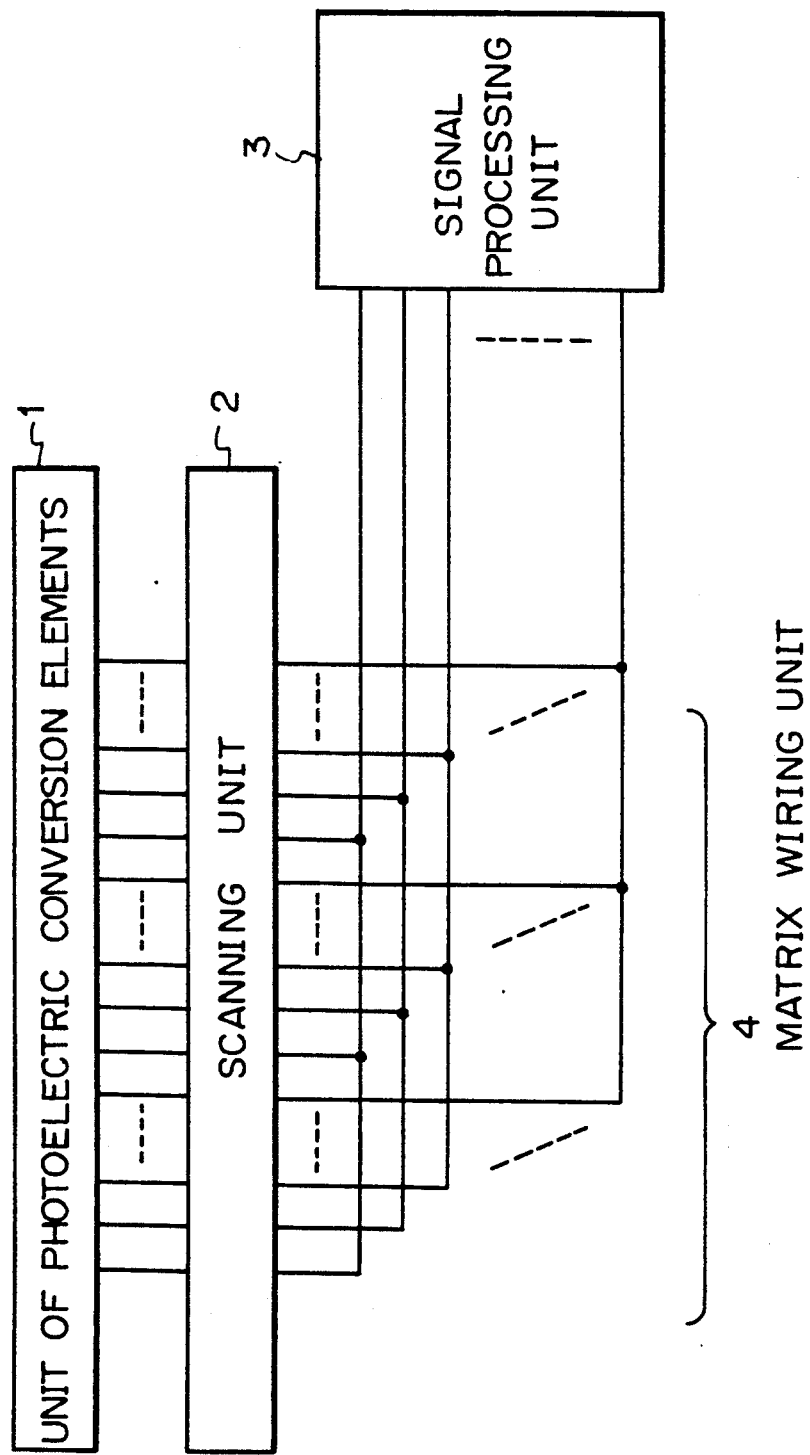
FIG. 1 shows a block diagram of a matrix-wired photo-electric converter.
Figure 2:
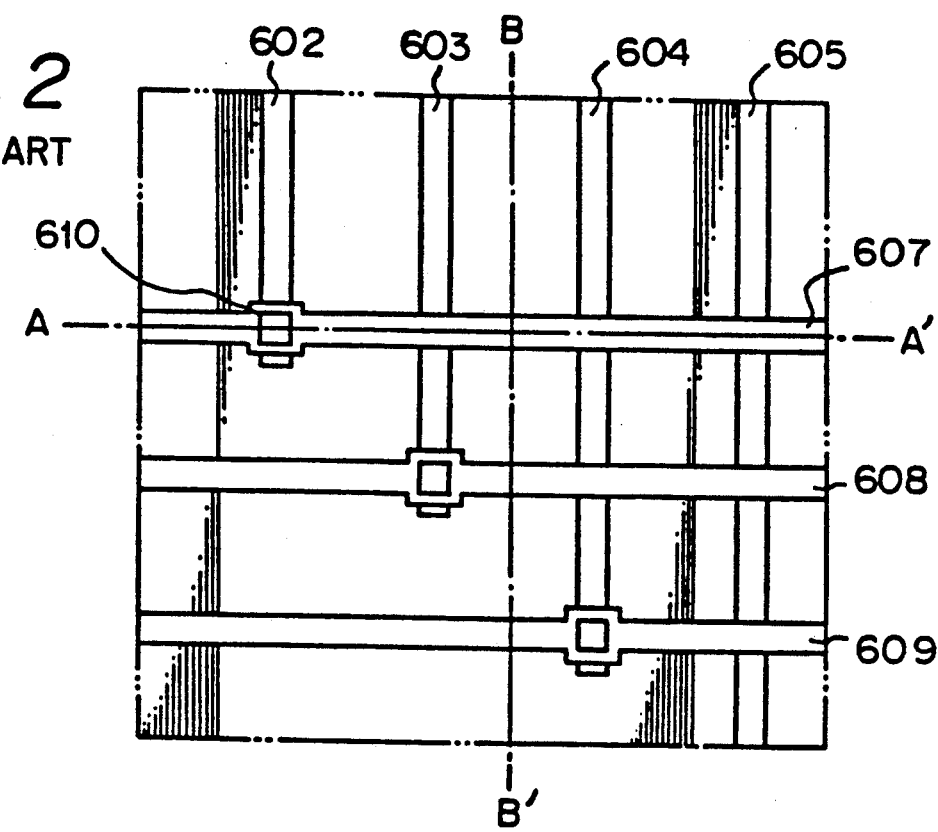
FIG. 2 shows a plan view of a prior art matrix wiring.
Figure 3A:
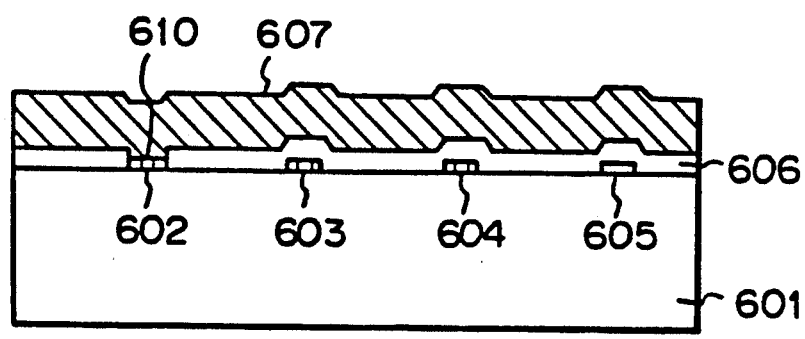
FIGS. 3(a) and 3(b) show sectional views taken along lines A-A' and B-B' of FIG. 2, respectively.
Figure 3B:
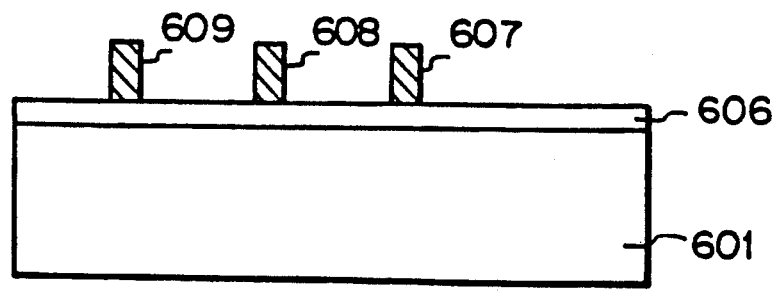
Figure 4:
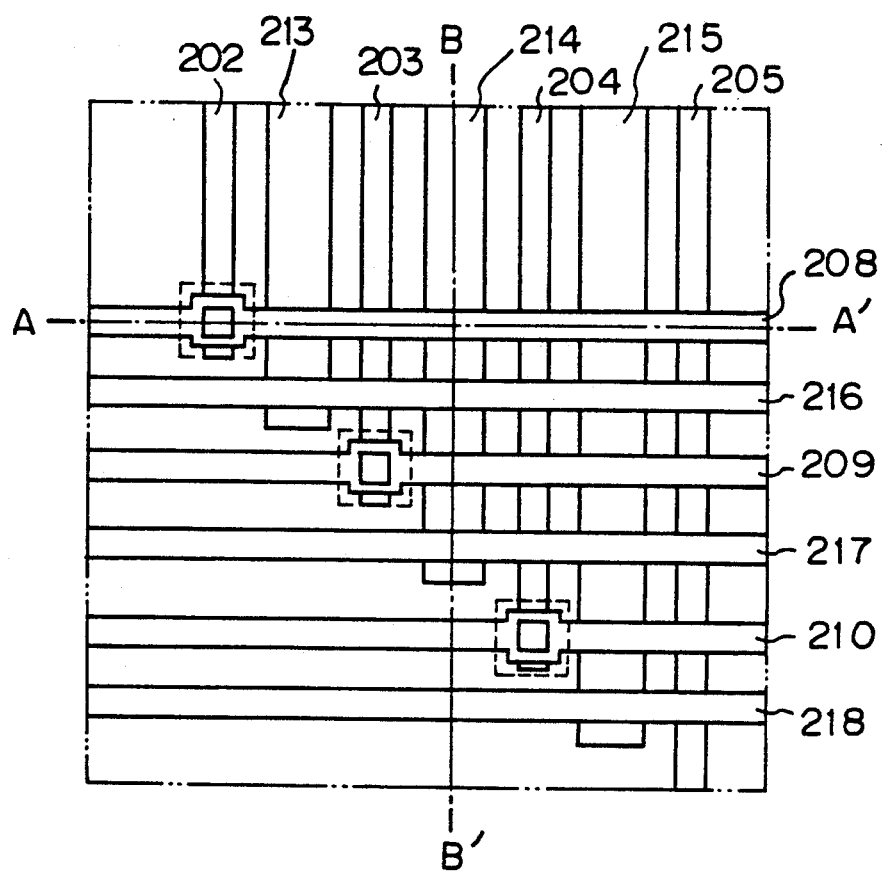
FIG. 4 shows a plan view of a matrix wiring unit in one embodiment of the present invention.
Figure 5A:
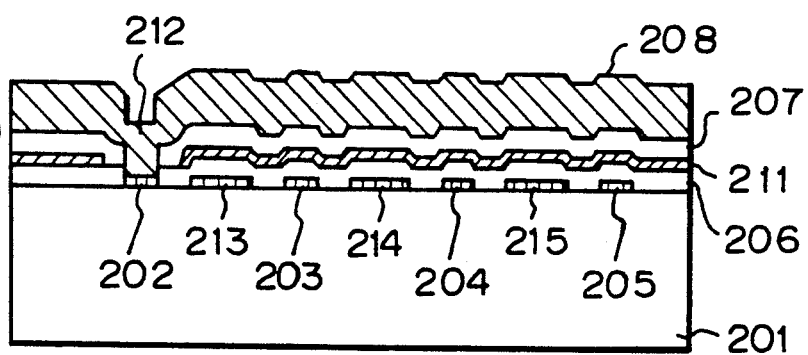
FIGS. 5(a) and 5(b) show sectional views taken along lines A-A' and B-B' of FIG. 4, respectively.
Figure 5B:
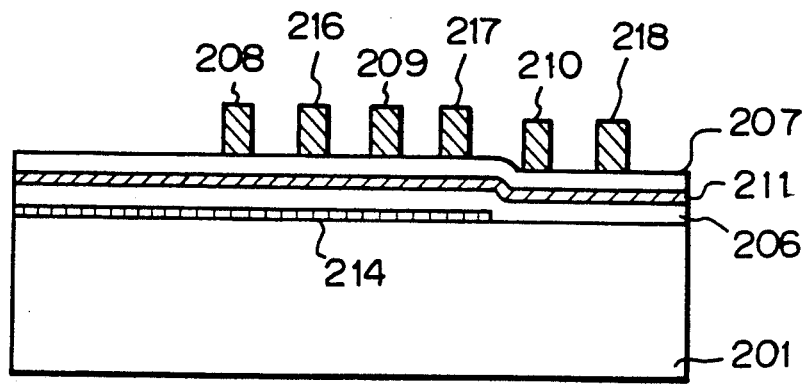

FIG. 4 shows a plan view of one embodiment of matrix wiring unit of the present invention, and FIGS. 5(a) and 5(b) show sectional views taken along lines A-A' and B-B' of FIG. 4. Photo-electric conversion element unit, scan unit and signal processing unit are identical those of FIG. 1 and hence they are omitted.

In FIGS. 5(a) and 5(b), numeral 201 denotes a substrate, numerals 202-205 denote discrete electrodes formed on the substrate 201, numeral 206 denotes a first insulating layer which covers the discrete electrodes 202-205, numeral 211 denotes a conductive layer formed on the first insulating layer 206 and connected to a power supply (not shown) of a constant potential, numeral 207 denotes a second insulating layer formed on the conductive layer 211, numerals 208-210 denote common lines formed on the second insulating layer 207, numeral 212 denotes a through-hole for making an ohmic contact between the discrete electrodes and the common lines, numerals 213-215 denote interline wirings formed among the discrete electrodes, and numerals 216-218 denote interline wirings formed among the common lines. The interline wirings 213-215 and 216-218 are connected to a power supply of a constant potential.

FIGS. 6(a)-6(f) show a manufacturing process of the matrix wiring unit of the present embodiment.

As shown in FIG. 6(a), the aluminum discrete electrodes 202-205 and the interline wirings 213-215 are formed on the insulating substrate 201.

Then, as shown in FIG. 6(b), the first insulating layer 206 which may be made of inorganic material such as $SiO_2$ or SiN:H or organic material such as polyimide is formed.

Then, as shown in FIG. 6(c), the Al conductive layer 211 is formed (excluding the ohmic contact areas), and as shown in FIG. 6(d), the second insulating layer 207 made of $SiO_2$, SiN:H or polyimide is formed. Then, as shown in FIG. 6(e), an area corresponding to the ohmic contact of the first insulating layer 206 and the second insulating layer 207 is etched away and the through-hole 212 is formed.

Finally, as shown in FIG. 6(f), the Al common line 208 and the interline wirings 216-218 (not shown) are formed on the second insulating layer 207 so that ohmic contacts are formed between the discrete electrodes and the common lines through the through-hole 212. In this manner, the desired matrix wiring unit is completed.

The first and second insulating layers may be laminated structures of $SiO_2$/SiN:H or inorganic material/organic material.

By providing the conductive layer kept at the constant potential at the insulated crosspoints of the discrete electrodes and the common lines, the stray capacitance between the discrete electrodes and the common lines is prevented. Further, by providing the wirings kept at the constant potential between the discrete electrodes and the common lines line-to line capacitance between the discrete electrodes and the common electrodes are avoided and the capacitive coupling of the lines is prevented. As a result, crosstalk between the output signals is prevented.

In accordance with the present embodiment, by the provision of the conductive layer kept at the constant potential at the crosspoints of the discrete output electrodes and the common electrodes of the photo-electric conversion elements, the stray capacitance at the insulated crosspoints of the discrete electrodes and the common lines is prevented, and by the provision of the wirings kept at the constant potential between the discrete electrodes and the common lines, the capacity between the electrodes and the lines is prevented.

We claim:

1. A photoelectric converter comprising:
   a photoelectric conversion unit comprising a plurality of photoelectric conversion elements arranged in an array extending in a first direction;
   a matrix wiring unit comprising a plurality of discrete output electrodes each electrically connected to a respective one of said photoelectric conversion elements for transmitting output signals from corresponding photoelectric conversion elements, and a plurality of common lines each electrically connected to at least two of said discrete output electrodes, for transmitting signals from said at least two corresponding discrete output electrodes, wherein said polarity of common lines are arranged along with, and substantially parallel to, a direction of an arrangement of said plurality of photoelectric conversion elements; and
   an intervening wiring provided between a pair of said plurality of common lines along with, and substantially parallel to, a direction of an arrangement of said plurality of photoelectric conversion elements, wherein said intervening wiring is at a constant potential.

2. A photoelectric converter according to claim 1, further comprising:
   a plurality of insulating layers; and a conductor layer sandwiched between said insulating layers at intersections between each of said discrete output electrodes and each of said common lines, for maintaining a constant potential.

3. A photoelectric converter according to claim 1, further comprising an output wiring provided between said discrete output electrodes for maintaining a constant potential.

4. A photoelectric converter according to claim 1, further comprising:
   a plurality of insulating layers;
   a conductive layer sandwiched between said insulating layers at intersections between each of said discrete output electrodes and each of said common lines for maintaining a constant potential; and
   an output wiring provided between said discrete output electrodes for maintaining a constant potential.

5. A photoelectric converter according to claim 1, further comprising in addition to said intervening wiring, additional intervening wirings, wherein said intervening wirings are provided at the same pitches.

6. A photoelectric converter according to claim 2 further comprising a plurality of insulating layers, made of a material selected from the group consisting of $SiO_2$, Si:H and polyimide.

7. A photoelectric converter according to claim 4 further comprising a plurality of insulating layers, made of a material selected from the group consisting of $SiO_2$, Si:H and polyimide.

8. A photoelectric converter according to claim 2 further comprising a plurality of insulating layers, wherein each of said insulating layers is a laminated structure of $SiO_2$ and SiN:H.

9. A photoelectric converter according to claim 4 further comprising a plurality of insulating layers, wherein each of said insulating layers is a laminated structure of $SiO_2$ and SiN:H.

10. A photoelectric converter according to claim 2 further comprising a plurality of insulating layers, wherein at least one of said insulating layers is made of a material selected from the group consisting of inorganic material and organic material.

11. A photoelectric converter according to claim 4 further comprising a plurality of insulating layers, wherein at least one of said insulating layers is made of a material selected from the group consisting of inorganic material and organic material.

12. A photoelectric converter according to claim 2 further comprising a plurality of insulating layers, wherein each of said insulating layers comprises a laminated structure made of a material selected from a group consisting of inorganic material and organic material.

13. A photoelectric converter according to claim 4 further comprising a plurality of insulating layers, wherein each of said insulating layers comprises a laminated structure made of a material selected from a group consisting of inorganic material and organic material.

14. A photoelectric converter according to claim 1, wherein said discrete output electrodes, said common lines, said conductive layer, and said wiring are made of the same conductive material.

15. A photoelectric converter according to claim 10, wherein said conductive material is Al.

16. A photoelectric converter according to claim 1 further comprising a scanning unit arranged between said photoelectric conversion unit and said matrix wiring unit for scanning each of said photoelectric conversion elements.

17. A photoelectric converter according to claim 16, wherein said photoelectric conversion unit, said matrix wiring unit, and said scanning unit are formed on a common substrate.

18. A photoelectric converter according to claim 1 further comprising an intermediate wiring arranged between said discrete output electrodes for maintaining a constant potential, wherein said intermediate wiring has a width greater than a width of one of the discrete output electrodes.

19. A photoelectric converter according to claim 1, wherein said photoelectric conversion elements are 1728 in number.

20. A photoelectric converter according to claim 1, wherein said photoelectric conversion elements are arranged with a density of 8/mm.

21. A photoelectric converter according to claim 1, wherein said plurality of photoelectric conversion elements are arranged in an array.

22. An image reader comprising:
a substrate;
a line sensor comprising a photoelectric conversion unit having a plurality of photoelectric conversion elements arranged in an array formed on said substrate extending in a first direction;
a matrix wiring unit comprising:
a plurality of discrete output electrodes each electrically connected to a respective one of said photoelectric conversion elements for transmitting output signals from corresponding photoelectric conversion elements;
common wirings each connected to at least two of said discrete output electrodes and arranged along with, and substantially parallel to, an arrangement direction of said photoelectric conversion elements for transmitting signals corresponding to said discrete output electrodes; and
an intervening wiring arranged between said common wirings substantially parallel to said common wirings;
signal processing means for processing the signals; and
means for maintaining said intervening wiring at a constant potential.

23. A facsimile apparatus incorporating a photoelectric converter, said photoelectric converter comprising:
a photoelectric conversion unit comprising a plurality of photoelectric conversion elements arranged in an array extending in a first direction;
a matrix wiring unit comprising a plurality of discrete output electrodes each electrically connected to a respective one of said photoelectric conversion elements for transmitting output signals from corresponding photoelectric conversion elements, and a plurality of common lines each electrically connected to at least two of said discrete output electrodes, for transmitting signals from said at least two corresponding discrete output electrodes, wherein said plurality of common lines are arranged along with, and substantially parallel to, a direction of an arrangement of said plurality of photoelectric conversion elements; and
an intervening wiring provided between a pair of said plurality of common lines along with, and substantially parallel to, a direction of an arrangement of said plurality of photoelectric conversion elements, wherein said intervening wiring is at a constant potential.

24. A facsimile apparatus incorporating an image reader, said image reader comprising:
a substrate;
a line sensor comprising a photoelectric conversion unit having a plurality of photoelectric conversion elements arranged in array formed on said substrate extending in a first direction;
a matrix wiring unit comprising:
a plurality of discrete output electrodes each electrically connected to a respective one of said photoelectric conversion elements for transmitting output signals from corresponding photoelectric conversion elements;
common wirings each connected to at least two of said discrete output electrodes and arranged along with, and substantially parallel to, an arrangement direction of said photoelectric conversion elements for transmitting signals corresponding to said discrete output electrodes; and
an intervening wiring arranged between said common wirings substantially parallel to said common wirings;
signal processing means for processing the signals; and
means for maintaining said intervening wiring at a constant potential.

* * * * *

UNITED STATES PATENT AND TRADEMARK OFFICE
CERTIFICATE OF CORRECTION

PATENT NO. : 5,027,176

DATED : June 25, 1991

INVENTOR(S) : Toshihiro Saika, et al

It is certified that error appears in the above-identified patent and that said Letters Patent is hereby corrected as shown below:

On the title page:

IN [56] REFERENCES CITED

U.S. PATENT DOCUMENTS, insert:
--4,931,661  6/1990  Fukaya ........... 250/578.1--.

COLUMN 4

Line 5, "and a" should read --and ¶ a--.
Line 67, "wiring" should read --wirings--.

COLUMN 6

Line 30, "in array" should read --in an array--.

Signed and Sealed this

Thirteenth Day of October, 1992

*Attest:*

DOUGLAS B. COMER

*Attesting Officer*     *Acting Commissioner of Patents and Trademarks*